(12) United States Patent  
Zeira

(10) Patent No.: US 7,259,324 B2  
(45) Date of Patent: Aug. 21, 2007

(54) PHOTOVOLTAIC SOLAR CELL

(75) Inventor: Eitan C. Zeira, Hollis, NH (US)

(73) Assignee: Konarka Technologies, Inc., Lowell, MA (US)

( * ) Notice: Subject to any disclaimer, the term of this patent is extended or adjusted under 35 U.S.C. 154(b) by 550 days.

(21) Appl. No.: 10/308,722

(22) Filed: Dec. 3, 2002

(65) Prior Publication Data

US 2003/0102024 A1 Jun. 5, 2003

Related U.S. Application Data

(60) Provisional application No. 60/337,265, filed on Dec. 5, 2001.

(51) Int. Cl.
*H01L 31/00* (2006.01)

(52) U.S. Cl. ...................................... 136/263; 136/256

(58) Field of Classification Search ......... 136/243–265
See application file for complete search history.

(56) References Cited

U.S. PATENT DOCUMENTS

| | | | | |
|---|---|---|---|---|
| 4,060,426 | A * | 11/1977 | Zinchuk ...................... | 136/263 |
| 4,204,216 | A * | 5/1980 | Heeger et al. ................ | 257/40 |
| 5,084,365 | A | 1/1992 | Gratzel et al. ............... | 429/111 |
| 5,482,570 | A * | 1/1996 | Saurer et al. ................ | 136/255 |
| 6,252,156 | B1 * | 6/2001 | Ono et al. ................... | 136/256 |
| 6,310,282 | B1 * | 10/2001 | Sakurai et al. .............. | 136/263 |
| 6,340,789 | B1 * | 1/2002 | Petritsch et al. ............ | 136/263 |
| 6,350,946 | B1 * | 2/2002 | Miyake et al. ............... | 136/252 |

| | | | |
|---|---|---|---|
| 2004/0084080 | A1 | 5/2004 | Sager et al. ................ 136/263 |

OTHER PUBLICATIONS

B. de Boer et al. "Supramolecular self-assembly and opto-electronic properties of semiconducting block copolymers." Polymer. 42, 9097-9109. (2001).*
R.N. Marks et al "The Photovoltaic Response in Poly (p-phenylenevinylene) Thin-Film Devices" pp. 1379-1394 J. Phys.: Condens. Matter 6 (1994).
B. O'Regan et al "A low-cost, high efficiency solar cell based on dye-senitized colloidal TiO2 films"pp. 737-740 Nature vol. 353 (1991).
A.C. Arango et al "Photovoltage On Conjugated Polyer Photovoltaics with a Titanium Dioxide Anode" pp. 149-153 Mat. Res. Soc. Symp. Proc. vol. 561 1999 Materials Research Society.
"Regiodefined Substituted Poly (2,5-thienylene)s", M.C. Gallazzi et al., from J. Poly. Sci. Part A: Polymer Chemistry, vol. 31, 1993, pp. 3339-3349.

(Continued)

*Primary Examiner*—Nam Nguyen
*Assistant Examiner*—Jeffrey Barton
(74) *Attorney, Agent, or Firm*—Fish & Richardson P.C.

(57) ABSTRACT

A photovoltaic cell comprising, a cathode layer, an electron donating layer, and an electron accepting anode structure comprising a collection region including one or a plurality of secondary collection regions attached to the collection region. The secondary collection regions of the anode preferably are in the shape of dispersed rod shaped branches extending within a continuous phase of the electron donating layer. The collection region is preferably located at a central point with respect to the secondary collection regions, to thereby provide a photovoltaic cell structure with improved charge collection and efficiency of operation.

17 Claims, 6 Drawing Sheets a partially broken away isometric view of the preferred embodiment of a polymeric based Photovoltaic cell.

OTHER PUBLICATIONS

"Novel, Highly Conducting, and Soluble Polymers from Anodic Coupling of Alkyl-Substituted Cyclopentadithiophene Monomers", G. Zotti et al., from Macromolecules 1994, 27, p. 1938.

"Whiskers of Poly (3-alkylthiophene)s", K.J. Ihn et al., from J. Poly. Sci. Part B: Polymer Physics, vol. 31, 1993, pp. 735-742.

"New Semiconductor Device Physics in Polymer Diodes and Transistors", J.H. Burroughes et al., from Nature. vol. 335, Sep. 8, 1998, pp. 137-141.

"Two-layer Organic Photovoltaic Cell", C.W. Tang, from Appl. Phys. Lett., vol. 48, No. 2, Jan. 13, 1986.

"Light-emitting Diodes Based on Conjugated Polymers", J.H. Burroughes et al., from Nature vol. 347, Oct. 11, 1990, pp. 539-541.

"Measurement of Absolute Photoluminescence Quantum Efficiencies in Conjugated Polymers", N.C. Greenham et al., from Chem Phys Letters 241, 1995, pp. 89-96.

"Semiconducting Polymer Diodes: Large Size, Low Cost Photodetectors with Excellent Visible-Ultraviolet Sensitivity", G. Yu et al., from Appl Phys Lett. 64 (25) Jun. 20, 1994.

"Charge Separation and Photovoltaic Conversion in Polymer Composites with Internal Donor/Acceptor Heterojunctions", G. Yu et al., J. Appl. Phys. 78 (7), Oct. 1, 1995, pp. 4510-4515.

"Charge Separation and Transport in Conjugated-Polymer/Semiconductor-Nanocrystal Composites Studied by Photoluminescene Quenching and Photoconductivity", N.C. Greenham et al., from Phy. Rev. B, vol. 54, No. 24, 1996, pp. 17628-17637.

"Efficient Photodiodes from Interpenetrating Polymer Networks", J.J.M. Halls et al., from Nature, vol. 376, 1995, 4510.

"Self-assembled Networks of Conducting Polyaniline: A New Class of Conducting Polymer Blends", A.J. Heger, from TRIP vol. 3, No. 2, Feb. 1995, pp. 39-47.

"A Low-Cost, High-Efficiency Solar Cell Based on Dye-Sensitized Colloidal $TiO_2$ films", B. O'Regan et al., from Nature, vol. 353, Oct. 24, 1991, pp. 737-740.

"Solid State Dye-Sensitized $TiO_2$ Solar Cell with Polypyrrole as Hole Transport Layer", Kei Murakoshi et al., from Chemistry Letters, 1997, pp. 471-472.

"Photovoltage in Conjugated Polymer Photovoltaics with a Titanium Dioxide Anode", A.C. Arango et al., from Mat. Res. Soc. Symp. Proc., 1999, vol. 561, pp. 149-153.

"Marked Enhancement of Photoconductivity and Quenching of Luminescence in Poly (2,5-dialkoxy-p-phenylenevinylene) upon C60 Doping", K. Yoshino et al., from Jpn. J. Appl. Phys. 1993, vol. 32, Part 2, No. 3A, pp. L 357- L 360.

"The Photovoltaic Response in Poly (p-phenylene vinylene) Thin-film Devices", R.N. Marks et al., from J. Phys.: Condens. Matter 6, 1994, pp. 1379-1394.

\* cited by examiner

Fig.1 - seperated charges must be transported to their electrodes without touching the opposite phase to avoid recombination

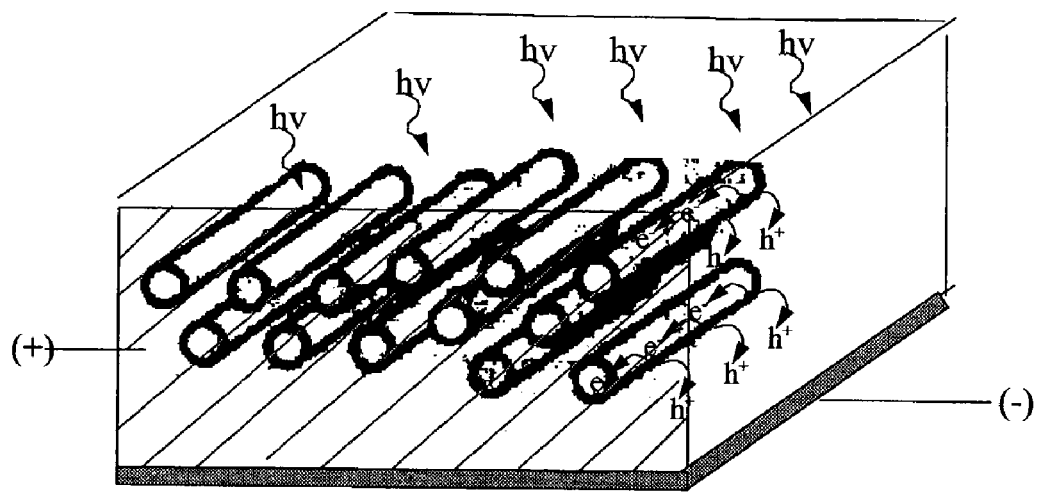
Figure 2: Schematic of a proposed geometry for efficient collection of carriers in a phase separated structure.

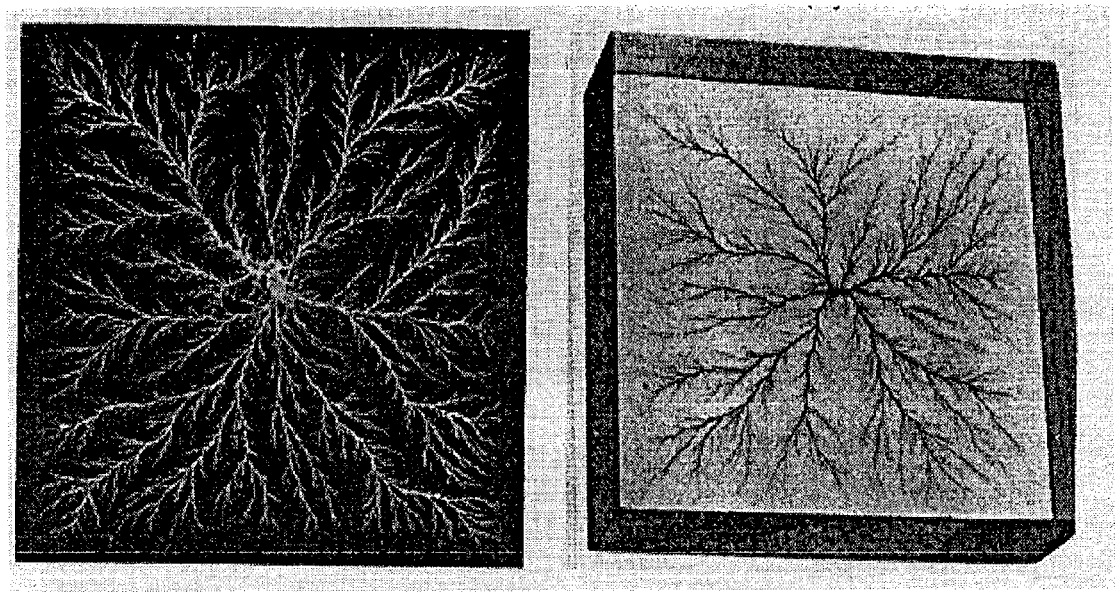
FIGURE 3: (a) top view of an "electrical tree" discharge pattern (b) sample with discharge pattern [22]

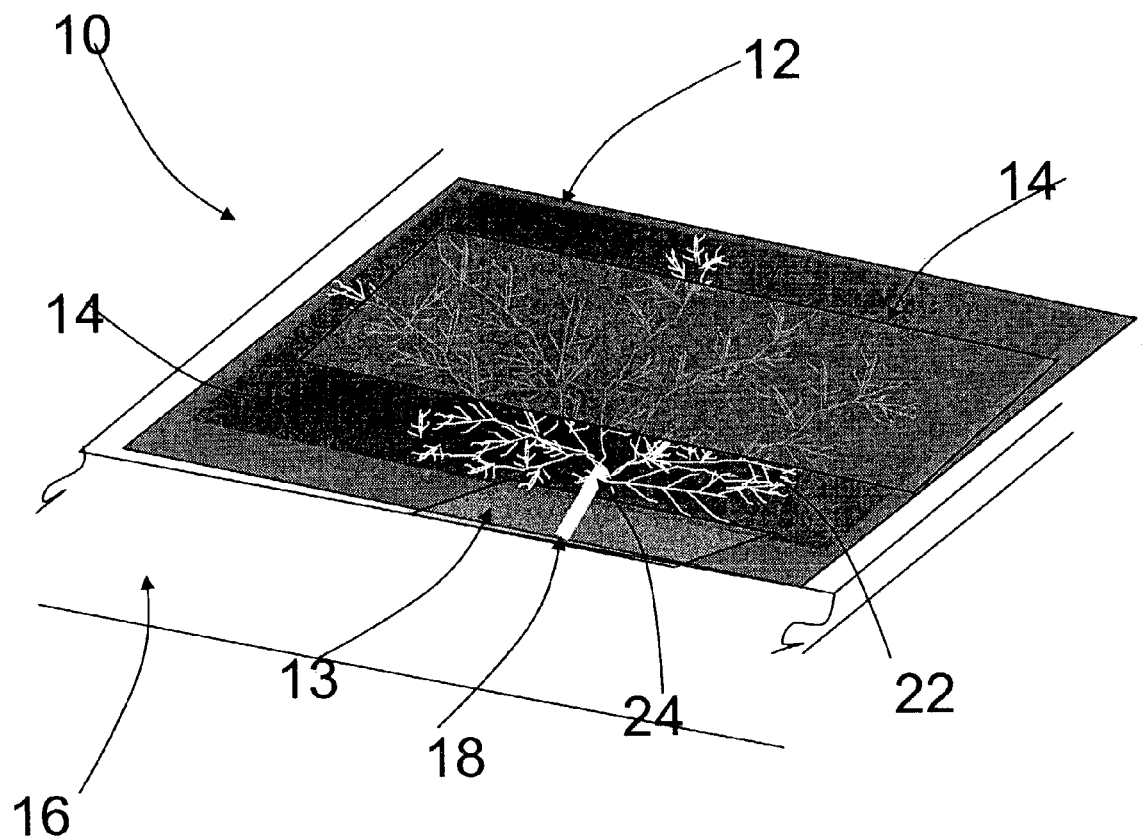
FIGURE4: a partially broken away isometric view of the preferred embodiment of a polymeric based Photovoltaic cell.

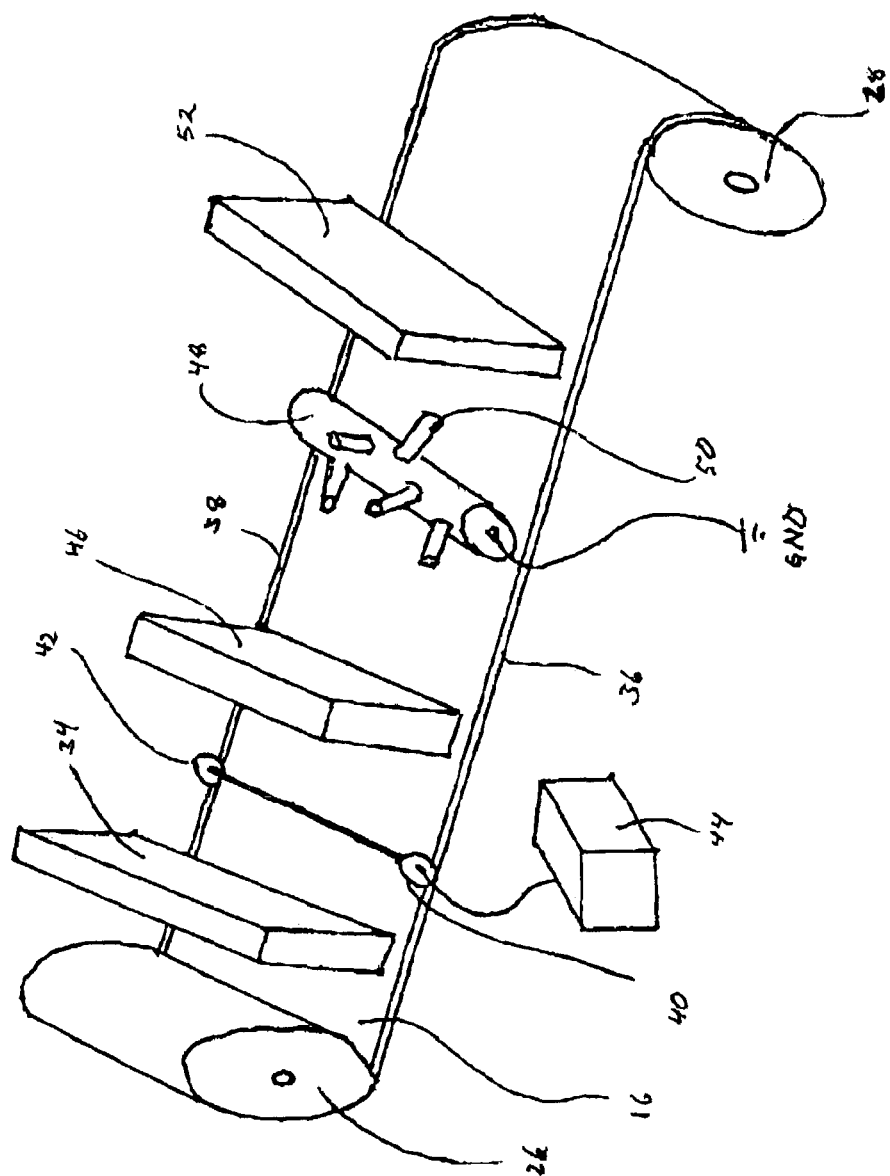
FIGURE 5: Schematic of a roll to roll process to produce solar cells according to the invention using Morphology control of Block copolymers.

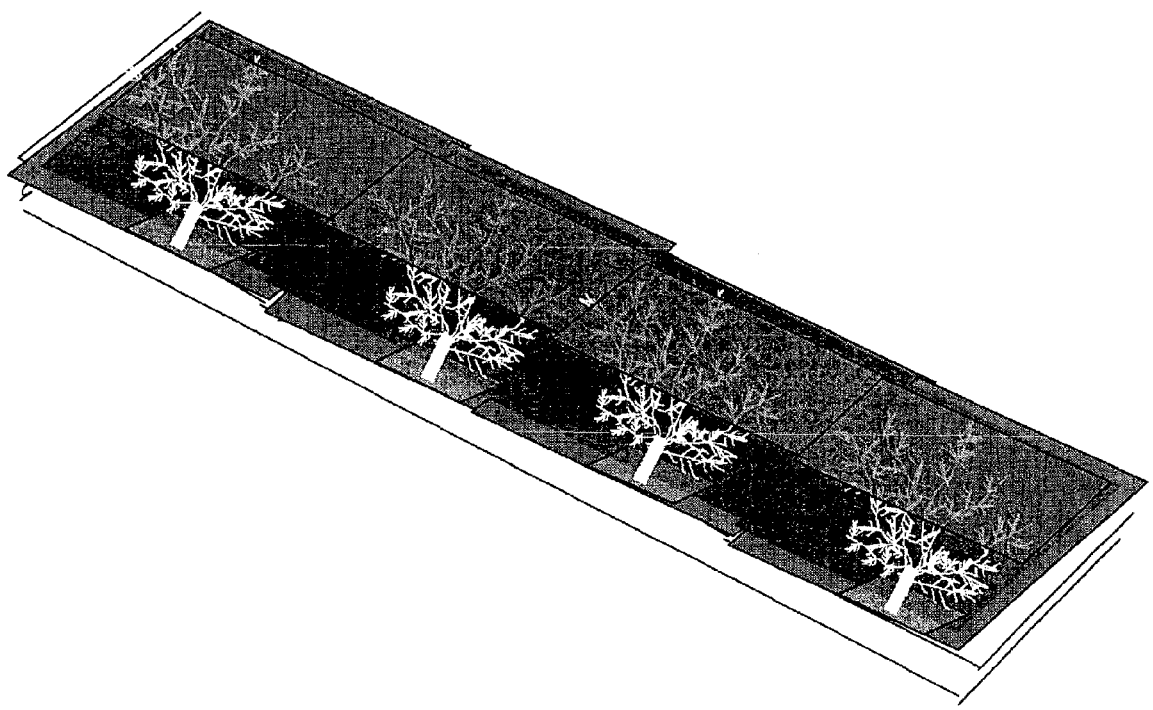
FIGURE 6: Section of a web with solar cells according to the invention using the printing method

PHOTOVOLTAIC SOLAR CELL

CROSS-REFERENCE TO RELATED APPLICATIONS

This application claims priority to U.S. Provisional Application Ser. No. 60/337,265, filed Dec. 5, 2001.

FIELD OF INVENTION

The present invention relates to photovoltaic cells and a method of producing such photovoltaic cells with improved charge collection and efficiency.

BACKGROUND OF THE INVENTION

In the past twenty years research activity has increased dramatically in the field of conductive polymers. The reason was the discovery that conjugated polymers can behave as metallic conductors and semiconductors. These polymers did not gain commercial significance because they were not stable. In the last five years work has concentrated on increasing the environmental stability and processability of these polymers. See, M. C. Gallazi et. al. "Regiodefined Substituuted Poly(2,5-thienylene)s, J. Poly. Sci. Part A: Polymer Chemistry, Vol. 31, 3339-3349 (1993); G. Zotti et. al. "Novel. Highly Conducting, and Soluble Polymers from Anodic Coupling of Alkyl-substituted Cyclopentadithiophene Monomers", Macromolecules 1994, 27, 1938-1942; and K. J. Ihn et. al. "Whiskers of Poly(3-alkylthiophene)s, J. Poly. Sci. Part B: Polymer Physics, Vol. 31, 735-742, (1993). In addition, it has been reported that the addition of side chains have rendered the various polymers more soluble and have therefore also stabilized, to some extent, their structure.

More recently, various papers have alluded to the advancement in semi-conducting polymer technology that are used as charge separators to produce photo-induced electron transfer. See, e.g., J. H. Burroughes et. al. "New Semiconductor Device Physics in Polymer Diodes and Transistors", Nature, Vol. 335, 8 Sept. 1998; R. N. Marks et. al. "The Photovoltaic Response in Poly(p-phenylenevinylene) Thin-Film Devices" J. Phys.: Condens. Matter 6 (1994); C. W. Tang Appl. Phys. Lett., Vol. 48, No. 2, 13 Jan. 1986; J. H. Burroughes et. al. Nature Vol. 347, Oct. 11, 1990 pp. 539-541;N. C. Greenham et. al. Chem Phys Letters 241 (1995) 89-86; and G. Yu et. al. Appl Phys lett. 64 (25) 20 Jun. 1994. These new materials provide "[a] molecular approach to high efficiency photovoltaic conversion" G. Yu et. al. The efficiency with which these polymers convert photons to electrons is near 100%. However, the overall efficiency of the cell is hindered by inefficient collection of the carriers. See, G. Yu et al. J. Appl. Phys. 78 (7), 1 Oct. 1995. N. C. Greenham et. al. reported "[t]he problem of transport of carriers to the electrodes without recombination is a more difficult one to solve, since it requires that once the electrons and holes are separated onto different materials, each carrier type has a path way to the appropriate electrode without needing to pass through a region of the other material". See, Phy. Rev. B, Vol. 54, No. 24, 1996, pp. 17628-17637. This problem appears to be the roadblock to continuing progress in this field.

G. Yu et. al. (J. Appl. Phys, 78(7), October 1995) and J. J. M. Halls et. al. (Natture, Vol. 376 (1995) 4510) suggested the problem can be alleviated by phase separation of the two charge carriers, thereby causing the photoinduced reaction at the donor/acceptor (D/A) interface to occur at the boundary between the two phases while allowing the separate carriers to migrate through their own phase (see FIG. 1). This solution offered some increase in efficiency (~2%), however, the disorder in the phase separated regions did not allow easy collection of the carriers.

A. J. Heegar (TRIP Vol. 3, No. 2, February 1995) attempted to increase the order in the phase separated blends by creating a network of one polymer in the other. The increase in efficiency was only marginal (~2.3%). The closest attempt to create the ideal structure was accomplished by B. O'Reagn et. al. (Nature, Vol. 353 (1991) 737) and U.S. Pat. No. 5,084,365. They accomplished it by using a mixture of dyes and nanometer sized titania particles. The resultant cell gave an energy conversion efficiency of 12%. The reason for this significant increase was due to the large surface area afforded by the nano particles in close proximity to the charge transfer couple material. In order to get this, however, they had to use liquid electrolyte that seeped into the "nooks and crannies" of the porous anode to establish an electric connection with the light active sites and harvest the holes that were created by them. The porous nature of the anode created the large D/A surface area while the liquid electrolyte acted as the hole collector in this case. In addition collection was done through an electrolyte via ion charge transfer rather than actual hole transport. The above work demonstrated that with an efficient collection scheme the overall energy conversion efficiency could be dramatically improved. The above cell however, is not conducive to large area roll to roll manufacturing, since it used liquid as one of the components in the cell.

Since then many researchers have tried to replace the liquid electrolyte with various solid electrolytes and other solid hole conductor materials with little success (a few % efficiency). See, e.g., Kei Murakoshi et. al. Chemistry letters, 1997 p. 471-472; A. C. Arango et. al. Mat. Res. Soc. Symp. Proc. Vol. 561 pp. 149-153; A. C. Arango et. al. Applied Phys. Letters Vo. 74, No. 12 pp. 1698-1700; K. Yoshino et. al. IEEE Trans. Elec. Dev 44 (8), p. 1315-1323 (1997); and R. N. Marks et. al. J. Phys Condens. Matter 6, p. 1379-94 (1994); and T. J. Savenje et. al. Chem Phys. Lett. 290, p. 297-303 (1998). The conclusions always returns to the same basic problem: to avoid recombination losses the layers need to be made very thin which in turn diminishes light absorption and hence charge generation. Alternatively, if the two materials are intermixed charge generation is high, but, collection is severely repressed due to a high recombination rate. Charge collection remains the key challenge for high efficiency and hence the commercialization of polymeric based solar cells.

To optimize the efficiency, and avoid the above problems of the prior art, an object of the present invention is to develop a photovoltaic cell wherein one electrode is connected to all the separate donor phases to collect the holes and another electrode is connected to all the individual acceptor regions to collect the electrons, thereby resulting in a high efficiency photovoltaic cell.

More specifically, it is an object of the present invention to develop the above referenced photovoltaic cell wherein rods of one phase (the electron accepting anode) are placed inside the matrix of the other phase (i.e., the electron donating cathode). Hence charge separation would be made to occur at the interface between the rods and the matrix while charge transport would take place through the rod anodes for one carrier and through the matrix cathode for the other.

Finally, in accordance with the objectives of the present invention, a means of making an electrical contact to all the electrical accepting anode rods in the matrix needs to be established. Such method then provides the means to allow charge collection into a single point i.e. to the electrode.

The present invention also has as its object the development of a structure to be used as an efficient means of collecting free electrons created by charge separation from photon excitation of a donor/acceptor pair. This configuration will then allow electron collection through the central point collector in the acceptor phase and hole collection via the electrical contact of the donor phase with a metal conductor layer.

SUMMARY OF THE INVENTION

A photovoltaic cell comprising a cathode layer, an electron donating layer, an electron accepting anode structure comprising a central collection region including one or a plurality of secondary collection regions attached to said collection region. An additional electron donating layer may be included to thereby provide an electron donating layer on both sides of the electron accepting anode structure.

BRIEF DESCRIPTION OF THE DRAWINGS

FIG. 1 illustrates a charge generation and transport in a donor/acceptor type solar cell.

FIG. 2 illustrates the use of electron accepting rods in a matrix type configuration.

FIG. 3 illustrates preferred configurations for the electron accepting rods of the present invention.

FIG. 4 illustrates a partially broken away isometric view of the preferred embodiment of the photovoltaic cell of the present invention.

FIG. 5 is a representational drawing of a continuous web manufacturing line for production of a block copolymer based photovoltaic cell of the present invention.

FIG. 6 illustrates a web with solar cells produced via the printing method of the present invention.

DETAILED DESCRIPTION OF THE PREFERRED EMBODIMENTS

A two phased system, created to achieve an efficient charge collection photovoltaic cell, wherein one of the species (the acceptor) is more electronegative than the other specie (donor) in a two phased system. The polymeric system is further present in a preferred controlled morphology comprising acicular (e.g., rod) shaped domains of the acceptor phase in a host matrix of the donor phase. The acicular shaped domains of the acceptor phase are preferably further present in a tree like arrangement within the continuous matrix of the donor phase. The acceptor phase is preferably comprised of a central collection point and many branch like structures that emanate from it.

In addition, it is preferable that with respect to the preferred photovoltaic cell of the present invention: (i) the electron accepting anode structure is disposed in the electron donating layer; (ii) the electron accepting anode is more electronegative than said electron donating layer; (iii) the electron accepting anode structure comprises $TiO_2$; (iv) the electron accepting anode structure comprises $TiO_2$ and conductive particles; (v) the conductive particles may comprise silver or gold; (vi) the electron accepting anode structure comprises an N-type semi-conductor material; (vii) the electron accepting anode structure comprises an N-type semi-conductor material and conductive particles.

The present invention is further directed at a method for producing polymeric based photovoltaic cells using continuous web manufacturing techniques, wherein a photovoltaic active polymeric system is applied to a substrate, acicular shaped domains of one of the components of the system are arranged into a tree like geometry, and the substrate is metallized, all in a roll to roll type manufacturing process.

As shown in FIG. 4, the basic structure of a preferred polymeric based photovoltaic cell, shown generally at 10, is a layered structure comprising three layers: a metallic (cathode) layer 12, a photovoltaic (PV) active layer 14, which is preferably polymer based, and a substrate 16, wherein all three layers are preferably present as an integral structure. As shown in FIG. 4, the photovoltaic cell 10 also includes a negative electrode 18 which preferably penetrates into PV layer 14. Electrode 18 penetrating into PV layer 14 is the anode of photovoltaic cell 10, with the circuit completed by metallic layer 12 serving as the cathode for photovoltaic cell 10.

In a polymeric based photovoltaic cell of the present invention, PV layer 14 is the active photovoltaic component. Therefore, in addition to the preferred structure of photovoltaic cell 10, the operation of the photovoltaic cell is to a degree dependent upon the composition and microstructure of PV layer 14. The photovoltaicly active system is composed of two species, and while both of the species of the system are semi-conducting, one species is preferably more electronegative than the other specie, herein referred to the acceptor specie and the donor specie respectively.

Furthermore, in the polymeric based photovoltaic cell the acceptor specie is preferably an N-type semi-conductor and the donor specie is P-type semi-conductor. The difference in electronegativity of the two species is a measure of the electron affinity of each specie, wherein the acceptor specie has a greater electron affinity than the donor specie. In addition to the relative electron affinities of the two species, the donor specie is selected from a group of semi-conducting polymers that are capable of inducing a charge separation upon excitation by electromagnetic radiation, that is the material is photo-conducting. Useful charge separation additionally prefers that the donor material has a high absorption in the visible spectrum of electromagnetic radiation.

In addition to the chemical characteristics of the species of the system, the morphology of PV layer 14 is preferably a network of interconnected branches of the acceptor specie in a continuous matrix of the donor specie. The network of branches preferably collect at a central point 24, a structure termed an electrical tree 22, as illustrated in FIG. 3. It is understood, however, that there are several alternatives to the the electrical tree configuration 22. For example, such alternatives may comprise a leaf type pattern, fractal pattern, etc.

Electrode 18 of photovoltaic cell 10 is positioned in PV layer 14 at a preferred central collection point 24 of electrical tree 22, as illustrated in FIG. 4. Electrical tree 22 extends, preferably, in a radial pattern from anode electrode 18 and is contained within PV layer 14.

In operation, a charge separation is induced in PV layer 14 at the interface of the rod domains of the acceptor material and the donor continuous phase. The free electrons are transported in the branches of electrical tree 22 to anode electrode 18, from which point the electrical flow can be utilized. The electrical circuit is completed by the return of the electrons to the donor continuous phase through metallic layer 12, serving as the cell cathode.

Provided that the conductive requirements of the species of PV layer 14 are satisfied, the morphological requirements of the system may be satisfied by several different alternatives. One way, as noted, is for the acceptor specie to be present as rod shaped domains in the donor continuous phase which are subsequently oriented to produce an interconnected structure. Another method is to electrochemically polymerize and disperse the acceptor specie in situ. Yet another method is to actually print the acceptor specie in the shape of a tree using a standard press with the acceptor material as the ink.

Yet another method involves the use of a blend of incompatible homopolymers, or block copolymers with incompatible blocks, in which the blocks or homopolymer blend comprise the acceptor polymeric specie and the donor polymeric specie. In either case, the proportion of the acceptor polymer specie to the donor polymer specie is controlled to achieve the preferred dispersed rod shaped domains of the acceptor polymeric specie in a continuous matrix of the donor polymer specie.

In the preferred embodiment substrate 16 is polyester film, however, substrate 16 may be selected from any material which can be metallized in a standard web metallization process. Alternate materials for substrate 16 include, but are not limited to, polycarbonate, polystyrene, acrylic, etc. Anode electrode 18 is preferable a high work function material including, but not limited to, gold, silver, copper, and carbon.

The layer structure can also be reversed in its construction. Top layer 14 can be coated directly onto the substrate followed by the tree structure 22 and a second layer 14. The cell is then completed by a cathode metal layer that is preferably vacuum coated as the top layer in this arrangement. Depending on ease of manufacture, either configuration will function as a high efficiency photovoltaic cell.

The basic photovoltaic cell 10 can further be improved by the addition of nonselective coating to top layer 14 or the bottom layer of the substrate depending on which configuration is chosen. The use of such non-reflective coatings will prevent the reflection of incident light, therein allow a greater quantity of light to proceed to PV layer 14. It is also possible to dope the preferred active photovoltaic polymer system with a conductive material to increase the overall electrical conductivity of PV layer 14. However, when selecting a dopant, both the type of dopant and the quantity used should be preferably controlled such that not only is the dopant generally uniformly dispersed in PV layer 14, but also to ensure that the morphology of the preferred polymer system is not adversely affected, i.e. the acceptor specie remaining in the preferred form of an elongated shaped domains arranged in a preferred electrical tree configuration. While meeting the above requirements, the dopant may be added to the polymer system either in solution, or during a compounding step prior to dissolving the polymer(s).

As a preferred process for manufacturing polymeric based photovoltaic cells, the present invention relies upon a continuous web roll to roll technique. There are several roll to roll methods that can be employed in the fabrication of the above cells. In the case of morphology control of both incompatible polymer systems as well as the case of electrochemical polymerization methods, a modified atmospheric roll coater is preferably used. By way of example, FIG. 5 depicts a roll to roll coater for the block copolymer system. In the figure, substrate film 16 is supplied from a source roll 26, and is supported by a number of rollers and idler wheels (omitted for clarity), and is finally collected on a take up roll 28, thereby creating a continuous web of substrate 16. Substrate film 16 is a metallized polymeric film (e.g. copper on Mylar). It is coated with a solution of a PV from a standard coating apparatus such as a Gravure, slot die, etc. 34. The PV solution is coated such as to leave exposed edges 36 and 38 of the metallized layer. The PV solution on substrate film 16 dries as the web continues to move. As drying progresses, the PV system phase separates into rod shaped domains of the acceptor polymer specie dispersed in a continuous donor polymer mix.

While the PV solution is drying an electric field is applied to substrate film 16, therein orienting the conducting polymer rod shaped domains perpendicular to the direction of the electric field. Substrate film 16 contains conductive edges 36 and 38 along which metallic idler wheels 40 and 41 travel. A high voltage power supply 44 is connected to each of the idler wheels 40 and 42 to bias the metal layer underneath the PV coating, and therein orient conductive rod shaped domains. When the PV solution has substantially dried, the PV layer is flooded with high energy electrons from electron beam unit 46. The now charged PV coating is discharged using a grounded rotating pin wheel 48, wherein the pin wheel 48 is rotated by the moving web. The grounding pins 50 on pin wheel 48 preferably comprise a high work function metal which intermittently make contact with the coated web at predetermined locations, both transversely and longitudinally, on moving substrate 16, thereby discharging the PV layer and forming an electrical tree discharge pattern. Subsequent to discharge of the web, a protective top coating is applied to the PV layer. The top layer preferably has anti-reflection properties. The top coating is applied using conventional techniques, for example using a sputtering apparatus 52. After the PV layer has been top coated, the web is collected to take up roll 28.

In an alternate preferred embodiment, after discharging the PV layer, the polymer layer may be completely dried and collected on take up roll 28 without a top coat. The metallizing process may be carried out as a secondary process, as before, using sputtering or other conventional coating methods.

While the above process is described in terms of continuous web manufacturing, the preferred manufacturing steps require only that the PV is coated onto a substrate from solution, thereby allowing the polymer system to self-assemble into rod shaped domains of the acceptor polymeric specie dispersed in a continuous matrix of the donor polymeric specie. The rod shaped domains are then ordered into an electrical tree arrangement by charging the PV layer and then discharging it through a single point.

The same coater as above can also be used for an alternative method of producing the patented structure using an electrochemical polymerization process instead of orienting block polymers. The PV coating is made instead, of fully polymerized and end terminated donor polymers along with monomers of the acceptor specie. The metallized undercoat is biased positive to 3 Volts. Polymerization of the acceptor monomers will proceed from the metallized layer. Polymer chains will grow in a random fashion from the metallized layer, and produce tree like structures all over the metal surface and imbedded in the donor polymer phase. Subsequent to polymerization of the acceptor chains and drying of the donor phase, a second metal layer is deposited onto the PV layer to serve as the cathode. The latter metallic layer preferably comprises a lower work function metal than the metal layer that is deposited onto the substrate. The metallic coating is applied using conventional techniques, for example using a sputtering apparatus 52. After the PV layer has been metallized, the web is collected to take up roll 28. No electron beam unit 46, nor grounding pin 48 are required for this method.

The third preferred process capable of producing the present invention cell structure is a standard printing press (i.e. offset lithography, letter press, flexography etc.). The substrate is metallized by a conventional web metallization process (e.g. vacuum evaporation, sputtering). The acceptor and donor species are dissolved or dispersed in a vehicle to be made into an ink suitable for the type of printing press chosen. The press should ideally have four printing towers or stations. The first tower is used to print a uniform pattern (i.e. flood coat) of the donor polymer in 4"-8" wide strips (or a few strips across of less width if the press is wide enough) leaving 2" gaps of exposed metal surface of the substrate between the strips. The next tower preferably prints a small square (2"×2") every 4" or so in the exposed area (i.e. in the unprinted gaps). The ink is a standard insulating varnish (e.g. UV ink, polyurethane, acrylic etc.).

The next tower then prints an image of a tree made of ink that contains the acceptor material. The last tower puts on a similar flood coat as the first tower using an ink also containing the donor polymer but with the addition of an environmentally stable binder (e.g. polyurethane). The pattern created by this optional method is depicted in FIG. 6. It shows a repeating tree pattern "sandwiched" between two layers of the donor material. The insulating pad isolates the anode and cathode from each other (i.e. the tree from the metallized substrate).

Based upon the foregoing disclosure, it shall be understood that the present invention has a variety of options and alternatives, all falling within the scope of the various claims, appended hereto.

What is claimed is:

1. A photovoltaic cell, comprising:
   (a) a cathode layer;
   (b) a continuous electron donating matrix; and
   (c) an electron accepting anode structure comprising a network of interconnected branches disposed in the continuous electron donating matrix, wherein the network comprises a primary collection branch and one or a plurality of additional collection branches attached to the primary collection branch,
   wherein the additional collection branches comprise acicular shaped domains, and the photovoltaic cell is devoid of an additional anode structure.

2. The photovoltaic cell of claim 1 wherein the electron accepting anode structure is more electronegative than the electron donating matrix.

3. The photovoltaic cell of claim 1 wherein the electron accepting anode structure comprises $TiO_2$.

4. The photovoltaic cell of claim 1, wherein the electron accepting anode structure comprises $TiO_2$ and conductive particles.

5. The photovoltaic cell of claim 4, wherein the conductive particles comprise silver or gold.

6. The photovoltaic cell of claim 1 wherein the electron accepting anode structure comprises an N-type semi-conductor material.

7. The photovoltaic cell of claim 1 wherein the electron accepting anode structure comprises an N-type semi-conductor material and conductive particles.

8. The photovoltaic cell of claim 1 wherein the electron accepting anode structure comprises a block copolymer, wherein one block of the copolymer comprises an electron acceptor domain, one block of the copolymer comprises an electron donating domain, and the domains are incompatible thereby forming phase boundaries between the domains.

9. The photovoltaic cell of claim 8 wherein the relative amounts of the electron acceptor domain and electron donating domain are controlled such that the acceptor domain becomes a dispersed domain in a continuous domain of the electron donating domain.

10. The photovoltaic cell of claim 1 wherein the electron accepting anode structure comprises a first polymer, the electron donating matrix comprises a second polymer, wherein the first polymer is incompatible in the second polymer thereby forming phase boundaries between the domains.

11. The photovoltaic cell of claim 1 wherein the electron donating matrix comprises a conjugated conductive polymer.

12. The photovoltaic cell of claim 1 wherein the electron donating matrix is selected from the group consisting of polythiophene, polyaniline, polypyrrole, polyarylene, polyphenylenevinylene, and mixtures thereof.

13. The photovoltaic cell of claim 1 wherein the electron donating matrix is a photovoltaic active layer.

14. The photovoltaic cell of claim 13 wherein the photovoltaic active layer comprises a polymer material including a dopant.

15. The photovoltaic cell of claim 1 wherein the cell includes a top coating for the electron donating matrix.

16. The photovoltaic cell of claim 1 wherein the cathode layer comprises a metallic layer.

17. The photovoltaic cell of claim 1 wherein the primary and additional collection branches of the electron accepting anode structure is comprised of gold, silver, copper, or carbon.

* * * * *